United States Patent [19]
Chen et al.

[11] Patent Number: 5,869,820
[45] Date of Patent: Feb. 9, 1999

[54] MOBILE WORK-IN-PROCESS PARTS TRACKING SYSTEM

[75] Inventors: Wu Jang Chen, Hsin-Chu; Chen Chin Chen, Miao-Li; Yih-Ting Chu, Hsin-Chu, all of Taiwan

[73] Assignee: Taiwan Semiconductor Manufacturing Co. Ltd., Hsin-Chu, Taiwan

[21] Appl. No.: 816,277

[22] Filed: Mar. 13, 1997

[51] Int. Cl.$^6$ ....................................................... G06F 3/03
[52] U.S. Cl. ...................... 235/376; 235/385; 235/441; 370/537; 370/542; 414/935; 414/940
[58] Field of Search ..................................... 235/376, 383, 235/385, 441; 370/537, 542; 414/935, 937, 940

[56] References Cited

U.S. PATENT DOCUMENTS 3,833,884  9/1974  Bigbie et al. ........................... 370/537

*Primary Examiner*—F. L. Evans
*Attorney, Agent, or Firm*—Tung & Associates

[57] ABSTRACT

A mobile work-in-process parts tracking system includes a vehicle for transporting the work-in-process parts stored in containers, a tag mounted on the container and a tag reader mounted on the vehicle for reading the tag and outputting data to a data concentrator which accepts data from a plurality of tag readers and then outputting data in a single cable by removably connecting to a data distributor mounted in the factory floor, such that the location of the WIP parts transported on the vehicle can be tracked and monitored.

20 Claims, 2 Drawing Sheets

MOBILE WORK-IN-PROCESS PARTS TRACKING SYSTEM

FIELD OF THE INVENTION

The present invention generally relates to a mobile work-in-process (WIP) parts tracking system and more particularly, relates to a mobile WIP parts tracking system utilizing a data concentrator mounted on a vehicle for reducing a multiplicity of wires to a single wire such that it can be conveniently connected to a data distributor mounted stationarily in the factory floor to enable the tracking of the WIP parts.

BACKGROUND OF THE INVENTION

In a manufacturing facility, a product usually has to be processed at many work stations or processing machines. The transporting or conveying of partially finished products, or work-in-process parts, is an important link in the total manufacturing process. The conveying process is especially important in the manufacturing of integrated circuit products. In fabricating an IC product, a multiplicity of fabrication steps, i.e., as many as several hundred, are usually required to complete the fabrication of an IC circuit. A semiconductor wafer or an IC chip must be transported between various fabrication stations for conducting various processes.

For instance, to complete the fabrication of an IC circuit, various steps of deposition, cleaning, ion implantation, etching and passivation steps must be completed before an IC chip can be packaged for shipment. Each of these fabrication steps must be performed in a different process machine, such as a chemical vapor deposition chamber, or an ion implantation chamber, an etcher, etc. A partially processed semiconductor wafer therefore must be conveyed between various work stations many times before it is completed. The conveying and the tracking of such WIP parts in a semiconductor fabrication plant therefore becomes a very important link in the total fabrication process.

Conventionally, partially finished semiconductor wafers or IC chips are conveyed in a fabrication plant by automated vehicles traveling on tracks or by manually operated push carts. For the conveying of semiconductor wafers, the wafers are normally loaded into cassettes and then placed in a container commonly known as a pod. The cassette of wafers can be loaded into a pod from the bottom of the pod since the top is sealed off to reduce the possibility of contamination. The pod that contains semiconductor wafers is then transported on a vehicle either in an automated fashion or in a manually operated fashion.

In a conventional method, the vehicles are equipped with shelves and guard rails surrounding the shelves for placement of containers or pods. For identifying and locating the various WIP parts contained in the pods, the pods are labeled with a tag positioned on the side of the pod. The tags can be read automatically by a tag reader that is normally mounted on the guard rails of the vehicle. Each tag reader has an output cable for outputting the data it reads. In a typical factory set-up, certain areas of the factory are designated as depots for stowing the vehicles and the containers it carries. At these designated areas, electrical receptacles are provided in the floor such that the output cable from each tag reader can be plugged in. For a typical manually operated push cart, six pods for carrying semiconductor wafers are normally loaded onto three separate shelves. Six separate output cables from the tag readers must then be plugged into six different electrical receptacles mounted in the floor in order to input data into a computer system for monitoring the whereabouts of the WIP parts. In operation, when an operator manually pushes a cart (or a cart may be moved automatically on a track) to the depot area, the operator must manually plug in the output cables six times in order to register the locations of the WIP parts carried on the cart. This becomes a very labor intensive process and thus not a desirable method of monitoring the WIP parts in a factory.

It is therefore an object of the present invention to provide a mobile work-in-process parts tracking system that does not have the drawbacks or shortcomings of the conventional system.

It is another object of the present invention to provide a mobile work-in-process parts tracking system that is capable of tracking a vehicle carrying a plurality of containers of WIP parts.

It is a further object of the present invention to provide a mobile work-in-process parts tracking system that is capable of tracking a plurality of parts containers that it carries by connecting a single cable to a data concentrator mounted in the factory floor.

It is another further object of the present invention to provide a mobile work-in-process part tracking system that utilizes a data concentrator for providing a common wire for ground and power supply to all the tag readers that it receives data from.

It is yet another object of the present invention to provide a work-in-process parts tracking system by using a data concentrator such that a single cable can be used to output all data received into the concentrator by plugging into a data distributor mounted in the factory floor.

It is still another object of the present invention to provide a work-in-process parts tracking system by utilizing a data concentrator which is mounted on the vehicle and outputting data from a single cable into a distributor which is mounted in the factory floor.

It is still another further object of the present invention to provide a method of tracking work-in-process parts in a manufacturing plant by transporting the parts on a vehicle and then reading data from the parts containers into a data concentrator such that a single cable output from the concentrator can be plugged into a data distributor located in the factory floor for monitoring the whereabouts of the WIP parts.

SUMMARY OF THE INVENTION

The present invention provides a method and apparatus for a mobile work-in-process part tracking system which utilizes a data concentrator and a data distributor such that data from a plurality of tag readers mounted corresponding to each parts container can be inputted into the data concentrator and then outputted in a single cable for connecting to the data distributor mounted in the factory floor.

In a preferred embodiment, a mobile work-in-process part tracking system can be provided which includes a vehicle for transporting WIP parts stored in at least one container, at least one tag positioned on the at least one container, at least one tag reader mounted on the vehicle corresponding to the position of the at least one tag, the at least one tag reader is capable of outputting data from the at least one cable, a data concentrator mounted on the vehicle that is capable of receiving data from the at least one cable and outputting data in a single cable, and a data distributor mounted stationarily in a position juxtaposed to a floor on which the vehicle rides for receiving data from the single cable.

The present invention is also directed to a mobile WIP parts tracking system that includes a plurality of WIP parts containers each having a tag, a vehicle for transporting the containers equipped with a plurality of tag readers for reading the tag, a data concentrator mounted on the vehicle for reducing an output line from each of the plurality of tag readers into a single output cable, a data distributor mounted stationarily adjacent to a floor the vehicle rides on for receiving the single output cable, and a data processing device for analyzing data from the data distributor and for monitoring the locations of the plurality of WIP parts containers.

The present invention is further directed to a method for tracking work-in-process parts in a manufacturing plant which can be carried out by the steps of first transporting WIP parts in at least one container on a vehicle, then providing at least one tag reader on the vehicle for reading a tag mounted on the at least one container and for outputting data from the at least one cable, then connecting the at least one cable to a data concentrator mounted on the vehicle capable of outputting data in a single cable, then removably connecting the single cable to a data distributor mounted in a stationary position juxtaposed to a floor which the vehicle rides on, and transmitting data from the data distributor to a data processing device for monitoring the location of the WIP parts.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a method and apparatus for a mobile work-in-process parts tracking system by utilizing a data concentrator capable of providing a common wire for ground and power supply to a plurality of tag readers mounted on a vehicle for transporting the WIP parts such that only a single cable is required for the outputting of such data.

In the present invention method and apparatus, work-in-process parts transported in a manufacturing plant by either an automated vehicle or a manually operated vehicle can be tracked and monitored. Containers, such as that of a pod for holding wafer cassettes, are first loaded on the shelves of a vehicle and then are provided with an identification tag on the side of the container. A plurality of tag readers are then mounted on the guard rails of the vehicle for reading the tags. Each of the tag readers feeds the information it reads into a data concentrator mounted either in the guard rails or under the shelf such that a plurality of cables are fed into the data concentrator. The data concentrator is capable of reducing the total number of lines required for transmitting data from 72 to 52, i.e., in the case where six containers are loaded on a vehicle, by combining all the common ground lines and the power supply lines. A single cable output from the data concentrator is then used to output data by removably connecting the cable to a data distributor mounted in the factory floor.

Figure 1:
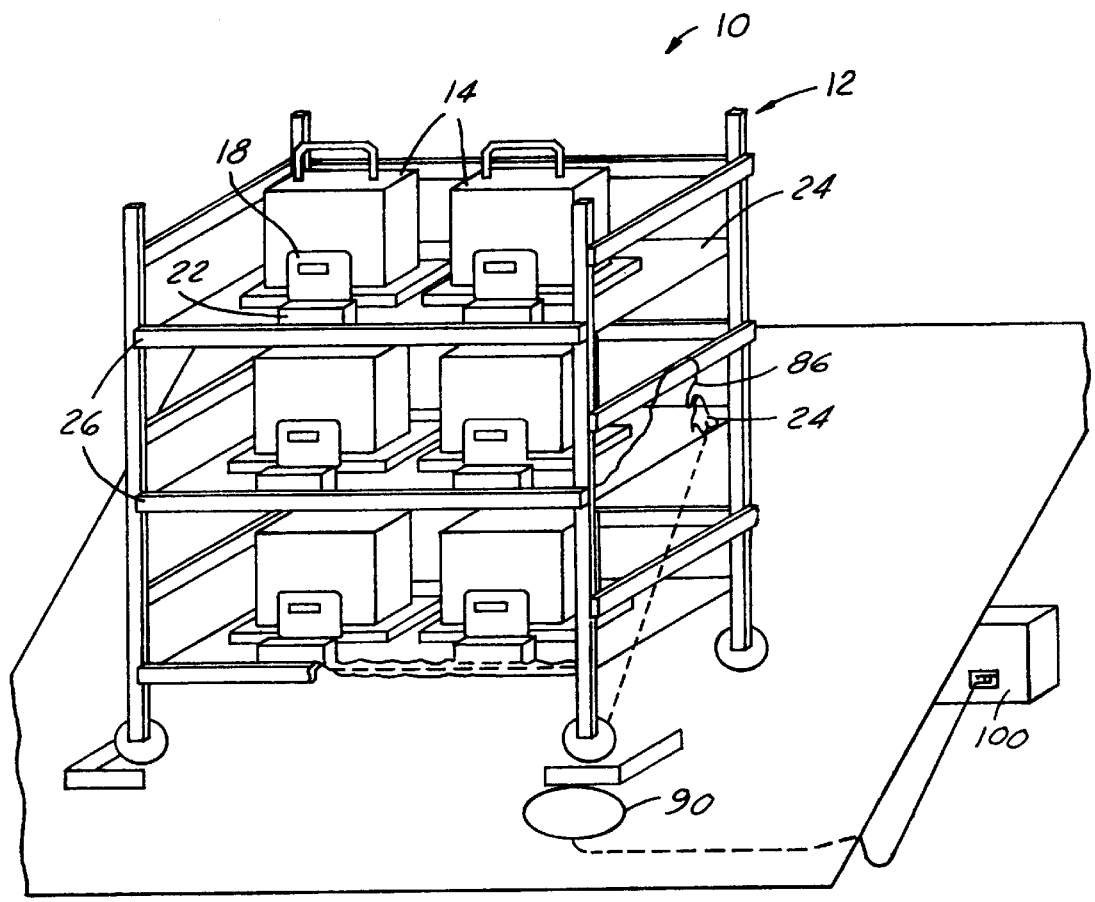
FIG. 1 is a perspective view of the present invention mobile work-in-process parts tracking system utilizing a manually operated push cart.

Referring initially to FIG. 1, wherein a perspective view of the present invention mobile work-in-process parts tracking system 10 is shown. The tracking system 10 includes a manually operated push cart 12, a plurality of parts containers 14, identification tags 18 positioned on the containers, and a plurality of tag readers 22 which are positioned corresponding to each tag on the containers. It should be noted that while a manually operated push cart 12 is illustrated in FIG. 1, the present invention method and apparatus can be equally applied to any other automated vehicles that rides on tracks and controlled by computers. The parts containers 14 may be a pod for holding wafer cassettes used in a semiconductor fabrication plant. The parts container 14 can also be any other type of containers for holding WIP parts. The pods 14 shown in FIG. 1 is commonly used in the semiconductor processing industry since it is designed to allow the loading and unloading of parts from the bottom and thus minimizing the chances of contamination. Depending on the size of the parts containers 14, each shelf 24 in the push cart 12 can hold a suitable number of parts containers.

The identification tags 18 positioned on the parts container 14 can be of any type that can be conveniently read by optical means or other means. The more commonly used identification tags are the electrical type which can be read by an infrared detector. The tags should be positioned at a convenient location on the parts container 14 such that it can be easily read by a suitably positioned tag reader 22. As shown in FIG. 1, a suitable position for mounting the tag readers 22 is on the guard rails 26 which runs along the front edges of the shelf 24 and provides a stop to prevent the parts containers 14 from accidentally falling off the shelf The tag readers 22 can be conveniently mounted to the guard rail 26 by conventional means such as by mechanical brackets (not shown). Each of the tag reader 22 requires, in the present example, 12 input/output lines. These lines include 8 data lines for an 8-bit data, a ground line, a power supply Vcc line, and 2 lines for sensing the presence of the parts container 14. The 12 lines are contained in a cable (not shown) which must be individually plugged into a receptacle in the factory floor in the conventional methods.

The present invention provides a much improved method of handling data output from each of the tag readers 22. The 12 lines from a single tag reader 22 is not directly plugged into a floor receptacle for receiving the data. Instead, the wires are fed to a data concentrator (not shown). A data concentrator is normally installed in the guard rail 26 or under the shelves 24 and thus is not shown in FIG. 1.

Figure 2:
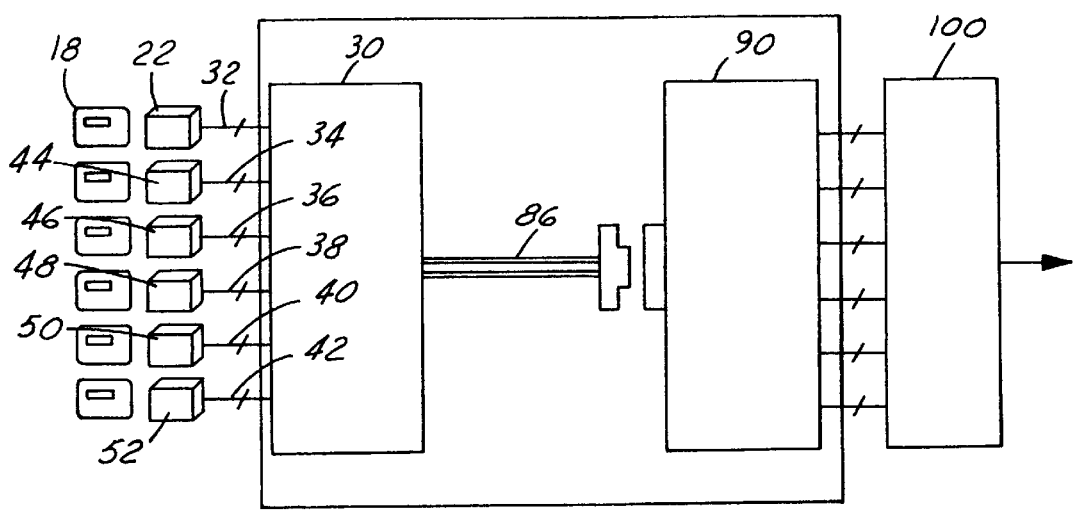
FIG. 2 is a process flow chart illustrating the present invention method for monitoring work-in-process parts.

As shown in FIG. 2, in the present illustration six parts containers 14 are used which require 6 tags 18 and 6 tag readers 22. Each of the output cable 32, 34, 36, 38, 40 and 42 consists of 12 individual lines include 8 data lines, 1 ground and 1 power supply line, and 2 container-sensing lines. The data concentrator 30 accepts the six data output cables 32–42 which consists of 8 data lines each, a ground and a power supply line, and 2 lines for sensing the presence of the container. A detailed wiring diagram of the data concentrator 30 is shown in FIG. 3.

Figure 3:
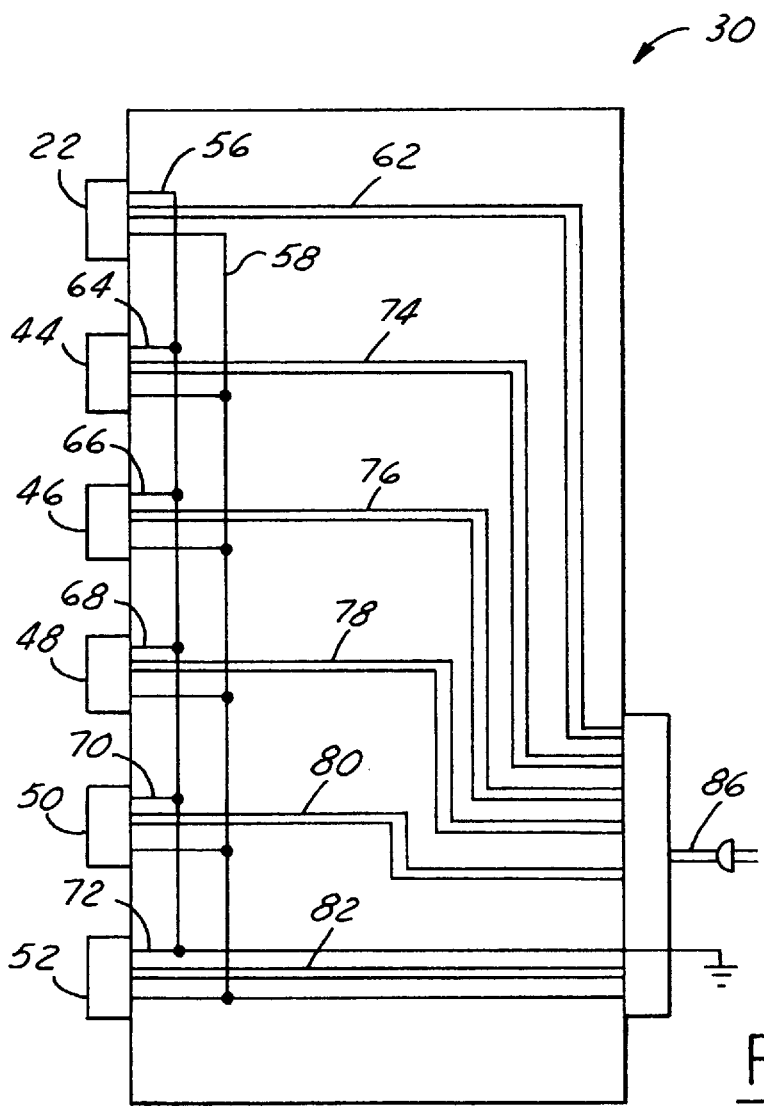
FIG. 3 is a circuit diagram illustrating the present invention method of providing a common wire for ground and power supply into a data concentrator.

FIG. 3 illustrates tag readers 22, 44, 46, 48, 50 and 52 each feeding 12 lines onto a printed circuit board to a data concentrator 30. The tag reader 22 feeds a ground line 56 and a power supply line 58 and eight data lines 62. The ground line 56 is connected to the ground lines 64, 66, 68, 70 and 72 and then fed into the data concentrator 30.

Similarly, the power supply line 58 of the tag reader 22 also connects to the power supply lines for tag readers 44–52 such that they are combined into one line and fed into the data concentrator 30. The data lines 74 for tag reader 44, 76 for tag reader 46, 78 for tag reader 48, 80 for tag reader 50, and 82 for tag reader 52 are fed into the data concentrator. In the present illustration, since each tag reader has 12 lines and four are combined with the other tag readers, a total of 72 lines are reduced to 52 lines by the data concentrator 30. A final output in a single cable 86 is used to feed all data lines to a data distributor 90 which is capable of re-distributing all the data lines from the six tag readers into twelve lines each and thus resuming its previous circuit before being processed by the data concentrator 30. This is shown in FIG. 2.

It should be noted that the data distributor 90 is mounted in the factory floor in a stationary position to accept the single cable output 86 from the data concentrator 30. It thus provides a labor saving method for the operator since only one cable needs to be removably connected to the data distributor 90 and not six. The data distributor 90 then feeds the individual data from the tag readers into a storage controller 100 which is a data processing unit and then fed into a WIP monitor. The data read from tag 18 by the tag reader 22 is therefore fed into the data processing unit 100 and shown in a WIP monitor to inform the operator the locations of the WIP parts. For an operator to locate certain WIP parts needed for the next fabrication step, the locations of the parts can be easily found by reading the WIP monitor.

The present invention provides a labor saving and cost saving method of tracking WIP parts in a fabrication plant. Any WIP part that is shipped in a parts container equipped with a tag and a tag reader on a vehicle can now be monitored through the present invention novel method and apparatus of the tracking system. It should be noted that while the tracking of semiconductor wafers shipped in containers of pods is used as an illustration for the present invention, any other parts that is partially fabricated in a manufacturing plant can be tracked by using the present invention novel method and apparatus. The present invention method is in no way limited to utilities in a semiconductor fabrication plant.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A mobile work-in-process (WIP) parts tracking system comprising:
   a vehicle for transporting WIP parts stored in at least one container,
   at least one tag positioned on said at least one container,
   at least one tag reader mounted on said vehicle corresponding to the position of said at least one tag, said at least one tag reader is capable of outputting data from at least one cable,
   a concentrator mounted on said vehicle capable of receiving data from said at least one cable and outputting data in a single cable, and
   a distributor mounted stationarily in a position juxtaposed to a floor on which the vehicle rides for receiving data from said single cable.

2. A system according to claim 1, wherein said WIP parts are electronic structures.

3. A system according to claim 1, wherein said WIP parts are semiconductor wafers.

4. A system according to claim 1, wherein said at least one container is at least one pod for transporting semiconductor wafers.

5. A system according to claim 1, wherein said vehicle is a manually operated push cart.

6. A system according to claim 1, wherein said at least one tag reader is an infrared detector.

7. A system according to claim 1, wherein said concentrator is capable of reducing data lines by using a common ground line and a common power supply line for said at least one container.

8. A system according to claim 1 further comprising a storage controller for processing data received from said distributor.

9. A system according to claim 1 further comprising a storage controller for processing data received from said distributor and a WIP monitor for monitoring the locations of said WIP parts.

10. A system according to claim 1, wherein said at least one cable from said at least one tag reader comprises a ground line, a power supply line and ten data lines.

11. A mobile WIP parts tracking system comprising:
    a plurality of WIP parts containers each having a tag,
    a vehicle for transporting said containers equipped with a plurality of tag readers for reading said tag,
    a data concentrator mounted on said vehicle for reducing output lines from said plurality of tag readers into a single output cable,
    a data distributor mounted stationarily adjacent to a floor the vehicle rides on for receiving said single output cable, and
    a data processing device for analyzing data from said data distributor and for monitoring the locations of said plurality of WIP parts containers.

12. A system according to claim 11, wherein said plurality of tag readers are infrared detectors.

13. A system according to claim 11, wherein said data concentrator provides a common ground line and a common power supply line for said plurality of tag readers.

14. A system according to claim 11, wherein said single output cable of said data concentrator is removably connected to said data distributor.

15. A system according to claim 11, wherein said data processing device comprises a storage controller and a WIP monitor.

16. A method for tracking work-in-process (WIP) parts in a plant comprising the steps of:
    transporting WIP parts in at least one container on a vehicle,
    providing at least one tag reader on said vehicle for reading a tag mounted on said at least one container and for outputting data from at least one cable,
    connecting said at least one cable to a concentrator mounted on said vehicle capable of outputting data in a single cable,
    removably connecting said single cable to a distributor mounted in a stationary position juxtaposed to a floor which the vehicle rides on, and transmitting data from said distributor to a data processing device for monitoring locations of said WIP parts.

17. A method according to claim 16, wherein said vehicle is a manually operated push cart.

18. A method according to claim 16, wherein said concentrator provides a common power supply line and a common ground line to said at least one tag reader.

19. A method according to claim 16, wherein said data processing device comprises a storage controller and a WIP monitor.

20. A method according to claim 16, wherein said tag on said at least one container is read by an infrared tag reader.

* * * * *